(12) United States Patent
Isohata (10) Patent No.: US 9,484,928 B2
(45) Date of Patent: Nov. 1, 2016

(54) OSCILLATOR, ELECTRONIC APPARATUS, AND MOVING OBJECT

(71) Applicant: SEIKO EPSON CORPORATION, Tokyo (JP)

(72) Inventor: Kensaku Isohata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/575,256

(22) Filed: Dec. 18, 2014

(65) Prior Publication Data

US 2015/0180481 A1  Jun. 25, 2015

(30) Foreign Application Priority Data

Dec. 24, 2013  (JP) ................................ 2013-265005

(51) Int. Cl.
*H03L 1/04* (2006.01)
*H03L 1/02* (2006.01)

(52) U.S. Cl.
CPC ............... *H03L 1/04* (2013.01); *H03L 1/028* (2013.01)

(58) Field of Classification Search
CPC ........................................................ H03L 1/02
USPC ................... 331/66, 68, 176, 69, 70
See application file for complete search history.

(56) References Cited

U.S. PATENT DOCUMENTS

| 3,483,485 A * | 12/1969 | Scherrer ............... 331/116 R |
| 6,559,728 B1 * | 5/2003 | Fry ............................. 331/69 |
| 8,760,231 B2 | 6/2014 | Shimodaira |
| 2006/0170510 A1 * | 8/2006 | Moriya ............... H03B 5/36 331/158 |
| 2009/0051447 A1 * | 2/2009 | McCracken ......... H03B 5/04 331/70 |
| 2009/0102567 A1 * | 4/2009 | Wacker ............... H03L 1/04 331/69 |
| 2009/0174488 A1 * | 7/2009 | Inouchi ............... H03L 1/04 331/77 |
| 2011/0074515 A1 | 3/2011 | Yoshida |
| 2011/0193637 A1 * | 8/2011 | Kasahara ..................... 331/68 |
| 2013/0221801 A1 | 8/2013 | Shimodaira |
| 2013/0321088 A1 * | 12/2013 | Vidoni et al. .............. 331/70 |

FOREIGN PATENT DOCUMENTS

| EP | 2 228 903 A1 | 9/2010 |
| JP | A-2008-312265 | 12/2008 |
| JP | A-2009-225093 | 10/2009 |
| JP | A-2010-187060 | 8/2010 |
| JP | A-2010-199778 | 9/2010 |
| JP | A-2010-213280 | 9/2010 |
| JP | A-2011-97553 | 5/2011 |

* cited by examiner

*Primary Examiner* — Jeffrey Shin
(74) *Attorney, Agent, or Firm* — Oliff PLC (57) ABSTRACT

An oscillator includes: an integrated circuit including a circuit for oscillation; a resonator element; a circuit element; a heating element, and a container. The integrated circuit, the resonator element, and the heating element are arranged inside the container. The circuit element is arranged outside the container.

16 Claims, 11 Drawing Sheets

OSCILLATOR, ELECTRONIC APPARATUS, AND MOVING OBJECT

BACKGROUND

1. Technical Field

The present invention relates to an oscillator, an electronic apparatus, and a moving object.

2. Related Art

Heretofore, as the size and thickness of electronic apparatuses have been reduced, oscillators including a vibrating device such as a quartz crystal resonator have been required to be further reduced in size and thickness. In addition, the power consumption of the oscillators has also been required to be reduced for achieving energy saving. Especially in an oven-controlled crystal oscillator (OCXO) having a structure in which the ambient temperature of a quartz crystal resonator is kept constant by heating a heating element for avoiding the influence of ambient temperature to provide high frequency stability, heat from the heating element is not uniformly conducted to an entire substrate, and it is difficult to control the temperature of a component for oscillation arranged around the quartz crystal resonator. Therefore, the OCXO has a problem of failing to obtain high frequency stability. For solving such a problem, JP-A-2010-213280 discloses an OCXO in which a quartz crystal resonator element is arranged on an integrated circuit having a heating element and an oscillation circuit arranged on one semiconductor substrate and is arranged in a package together with other circuit elements.

However, in the case where the circuit element is built into the package for adjusting a resonator element, a circuit for oscillation, or the like as in the OCXO described above, when a circuit element or the like using resin is used as a constituent member for example, frequency characteristics of the resonator element may be varied due to a gas generated by the resin as a constituent member, or a gas generated from solder, a conductive adhesive, or the like as a member for connecting the circuit element with the package.

Moreover, since the heating element and the circuit for oscillation are arranged on one semiconductor substrate, it is necessary to raise the temperature of the heating element to a heating temperature or higher of the quartz crystal resonating element for heating the quartz crystal resonating element to a required temperature. However, since the heat of the heating element is easily conducted to the circuit for oscillation arranged on the same semiconductor substrate, the circuit for oscillation may be overheated, and thus the performance of the circuit for oscillation may be deteriorated.

SUMMARY

An advantage of some aspects of the invention is to solve at least a part of the problems described above, and the invention can be implemented as the following modes or application examples.

APPLICATION EXAMPLE 1

This application example is directed to an oscillator including: an integrated circuit including a circuit for oscillation; a resonator element; a circuit element; a heating element; and a container, wherein the integrated circuit, the resonator element, and the heating element are arranged inside the container, and the circuit element is arranged outside the container.

According to this application example, the circuit element for adjusting the resonator element, the circuit for oscillation, or the like is arranged outside the container in which the integrated circuit, the resonator element, and the heating element are arranged. Therefore, a gas is not generated from a resin member constituting the circuit element, or solder, a conductive adhesive, or the like as a member for connecting the circuit element with the container, due to the heat of the heating element. Moreover, even if a gas is generated, the resonator element is not affected by the gas because the resonator element is accommodated in the container. Therefore, there is an advantageous effect in that stable frequency characteristics of the resonator element are maintained and thus the oscillator having high frequency stability can be obtained. Moreover, since the integrated circuit including the circuit for oscillation and the heating element are separated from each other, the integrated circuit is not overheated when heating the resonator element. Therefore, the resonator element can be stably oscillated, and thus the oscillator having high frequency stability can be obtained.

APPLICATION EXAMPLE 2

This application example is directed to the oscillator according to the application example described above, wherein the circuit element includes a quartz crystal resonator.

According to this application example, when a quartz crystal resonator is used as the circuit element, a feedback circuit of the circuit for oscillation is caused to have frequency selectivity to obtain a narrow-band negative resistance characteristic, and an unnecessary spurious negative resistance can be made small or positive. Therefore, unnecessary spurious oscillation can be suppressed. Therefore, there is an advantageous effect in that an unnecessary frequency is suppressed, the oscillator can be oscillated only in a primary vibration, and thus the oscillator having high frequency stability can be obtained.

APPLICATION EXAMPLE 3

This application example is directed to the oscillator according to the application example described above, wherein the circuit element includes an inductance element.

According to this application example, when an inductance element is used as the circuit element, an LC resonant circuit can be configured in combination with a capacitive element. By making the frequency of the LC resonant circuit coincident with the frequency of the primary vibration, a feedback circuit of the circuit for oscillation is caused to have frequency selectivity to obtain a narrow-band negative resistance characteristic, and an unnecessary spurious negative resistance can be made small or positive. Therefore, unnecessary spurious oscillation can be suppressed. Therefore, there is an advantageous effect in that an unnecessary frequency is controlled, the oscillator can be oscillated only in the primary vibration, and thus the oscillator having high frequency stability can be obtained.

APPLICATION EXAMPLE 4

This application example is directed to the oscillator according to the application example described above, wherein the resonator element is an SC-cut quartz crystal resonator element, and the circuit element is for attenuating an unnecessary frequency of frequency signals output from the circuit for oscillation.

According to this application example, an SC-cut quartz crystal resonator element is used as the resonator element, so that an oscillator having excellent frequency stability can be configured. Moreover, a secondary vibration mode, which is called a B mode and acts as a limiting factor for stable primary vibration called a C mode occurring in the oscillation of the SC-cut quartz crystal resonator element, is controlled by the circuit element such as a quartz crystal resonator or an inductance element, so that there is an advantageous effect in that the oscillator having high frequency stability can be obtained.

APPLICATION EXAMPLE 5

This application example is directed to the oscillator according to the application example described above, wherein the circuit element is arranged on the container.

According to this application example, the circuit element is arranged on an outer surface of the container in which the heating element is arranged, so that the heat of the heating element can be conducted to the circuit element. Therefore, there is an advantageous effect in that characteristics of the circuit element can be held constant, the influence of external temperature change can be reduced, and thus the oscillator having high frequency stability can be obtained.

APPLICATION EXAMPLE 6

This application example is directed to the oscillator according to the application example described above, wherein the circuit element overlaps the heating element in a plan view.

According to this application example, the circuit element is arranged, on the outer surface of the container in which the heating element is arranged, in a region overlapping the heating element in the plan view, so that a distance from the heating element to the circuit element can be reduced, and further heat of the heating element can be conducted to the circuit element. Therefore, there is an advantageous effect in that the influence of external temperature change can be further reduced, and thus the oscillator having high frequency stability can be obtained.

APPLICATION EXAMPLE 7

This application example is directed to the oscillator according to the application example described above, wherein the integrated circuit and the heating element are spaced apart from each other, and the resonator element is arranged on the heating element.

According to this application example, since the integrated circuit and the heating element are arranged spaced apart from each other inside the container, the heat of the heating element heating the resonator element is not directly conducted to the integrated circuit. Therefore, it is possible to reduce the characteristic degradation of the circuit for oscillation included in the integrated circuit caused by overheating. Moreover, since the resonator element is arranged on the heating element, the heat of the heating element can be conducted to the resonator element without loss of the heat, and thus temperature control of the resonator element can be further stabilized at low power consumption.

APPLICATION EXAMPLE 8

This application example is directed to an electronic apparatus including the oscillator according to the application example described above.

According to this application example, there is an advantageous effect in that the electronic apparatus including the oscillator having high frequency stability can be obtained.

APPLICATION EXAMPLE 9

This application example is directed to a moving object including the oscillator according to the application example described above.

According to this application example, there is an advantageous effect in that the moving object including the oscillator having high frequency stability can be configured.

BRIEF DESCRIPTION OF THE DRAWINGS

The invention will be described with reference to the accompanying drawings, wherein like numbers reference like elements.

FIGS. 1A and 1B are schematic configuration diagrams of an oscillator according to a first embodiment of the invention, in which

FIGS. 2A and 2B are schematic configuration diagrams of a container constituting the oscillator according to the first embodiment of the invention, in which

FIGS. 5A and 5B are schematic configuration diagrams of an oscillator according to a second embodiment of the invention, in which

FIGS. 6A and 6B are schematic configuration diagrams of an oscillator according to a third embodiment of the invention, in which

FIGS. 7A and 7B are schematic configuration diagrams of an oscillator according to a fourth embodiment of the invention, in which

FIGS. 8A and 8B are schematic configuration diagrams of an oscillator according to a fifth embodiment of the invention, in which

FIGS. 9A and 9B are schematic diagrams each showing an electronic apparatus including the oscillator according to the invention, in which

DESCRIPTION OF EXEMPLARY EMBODIMENTS

Hereinafter, embodiments of the invention will be described in detail based on the drawings.

Oscillator

First Embodiment

As an example of an oscillator 1 according to a first embodiment of the invention, an oven-controlled crystal oscillator (OCXO) including an SC-cut quartz crystal resonator element having excellent frequency stability will be shown and described with reference to FIGS. 1A to 2B.

Figure 1A:
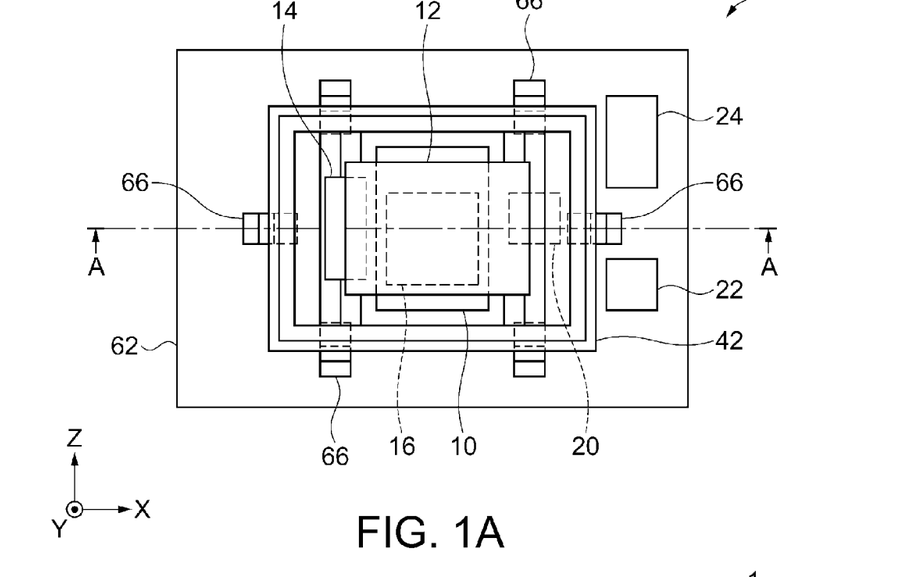
FIG. 1A is a plan view.
Figure 1B:
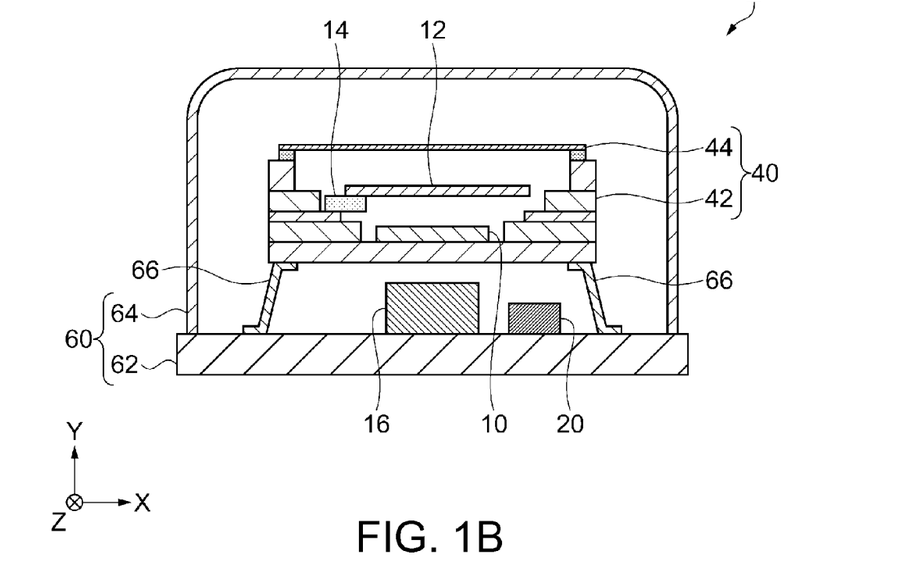
FIG. 1B is a cross-sectional view taken along the line A-A.
Figure 2A:
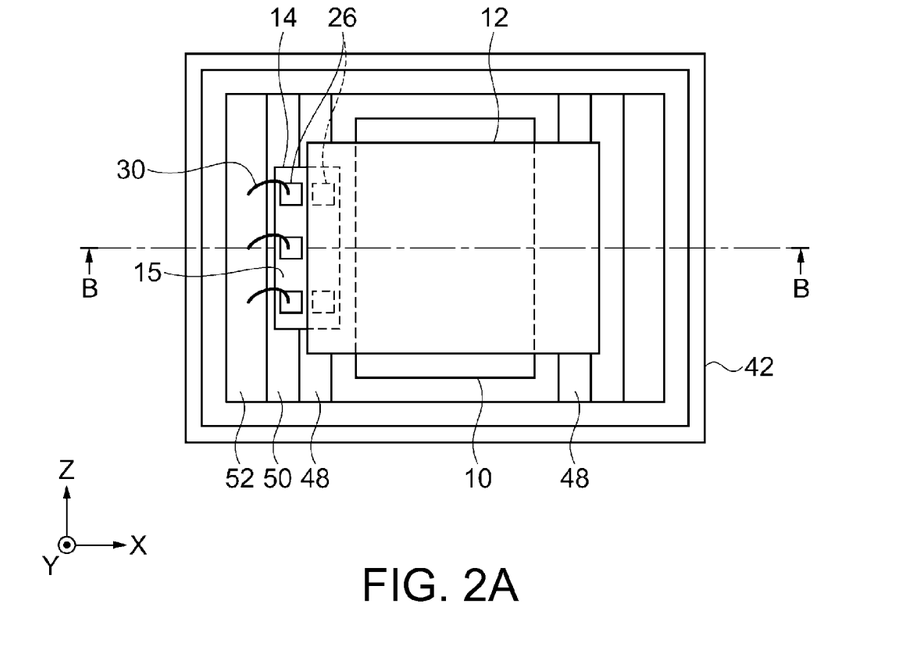
FIG. 2A is a plan view.
Figure 2B:
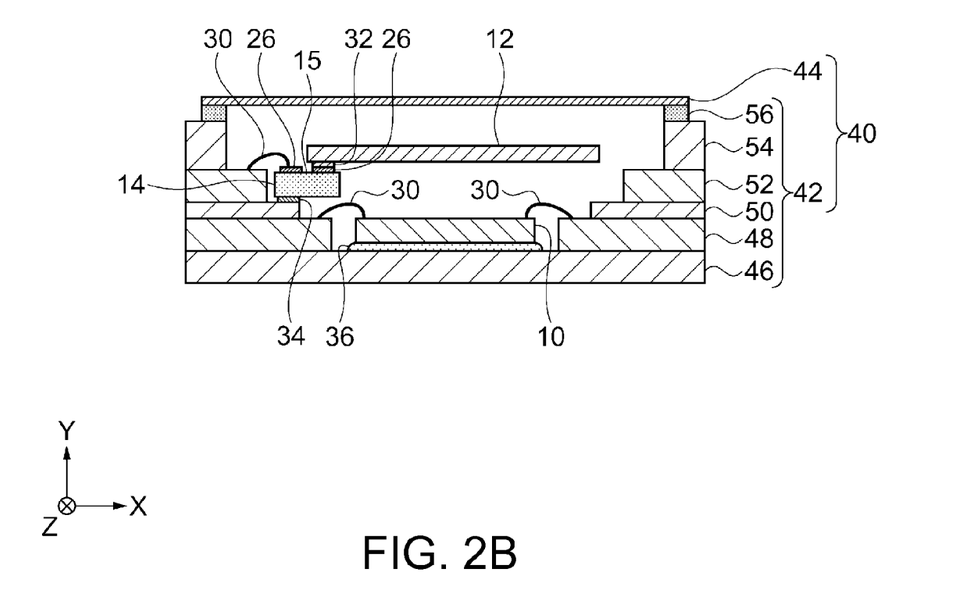
FIG. 2B is a cross-sectional view taken along the line B-B.

FIGS. 1A and 1B are schematic diagrams showing a structure of the oscillator 1 according to the first embodiment of the invention, in which FIG. 1A is a plan view, and FIG. 1B is a cross-sectional view taken along the line A-A shown in FIG. 1A. FIGS. 2A and 2B are schematic configuration diagrams of a container 40 constituting the oscillator 1 according to the first embodiment of the invention, in which FIG. 2A is a plan view, and FIG. 2B is a cross-sectional view taken along the line B-B shown in FIG. 2A. In FIGS. 1A and 2A, the oscillator 1 and the container 40 in a state where a cover 64 and a lid member 44 are removed therefrom are shown for convenience of description of the inner configurations of the oscillator 1 and the container 40. Moreover, for convenience of description, an X-axis, a Y-axis, and a Z-axis are shown as three axes orthogonal to each other in the drawings including those described later. Further, for convenience of description, in a plan view as viewed from the Y-axis direction, a surface in the positive Y-axis direction is referred to as an upper surface, and a surface in the negative Y-axis direction is referred to as a lower surface. A wiring pattern or electrode pads formed on an upper surface of a base substrate 62, connection terminals formed on an outer surface of the container 40, and a wiring pattern or electrode pads formed inside the container 40 are not shown in the drawings.

As shown in FIGS. 1A and 1B, the oscillator 1 is configured to include an integrated circuit 10 including a circuit for oscillation, the container 40 accommodating a heating element 14 and a resonator element 12 as an SC-cut quartz crystal resonator element therein, and a circuit element 16 arranged on the upper surface of the base substrate 62 outside the container 40. Moreover, on the upper surface of the base substrate 62 of the oscillator 1, the container 40 is arranged separate from the base substrate 62 via lead frames 66, and a plurality of circuit components 20, 22, and 24 such as a capacitor or a resistor are arranged. Further, the container 40 and the circuit element 16 are covered with the cover 64, and accommodated inside a container 60. The inside of the container 60 is hermetically sealed in a reduced-pressure atmosphere such as vacuum, or an inert gas atmosphere such as nitrogen, argon, or helium.

The circuit element 16 for adjusting the resonator element 12, the circuit for oscillation included in the integrated circuit 10, or the like, and the circuit components 20, 22, and 24 are arranged outside the container 40 in which the heating element 14 is accommodated. Therefore, a gas is not generated from a resin member constituting the circuit element 16, or solder, a conductive adhesive, or the like as a member for connecting the circuit element 16 or the circuit components 20, 22, and 24 with the container 40, due to heat of the heating element 14. Moreover, even if a gas is generated, the resonator element 12 is not affected by the gas because the resonator element 12 is accommodated in the container 40. Therefore, stable frequency characteristics of the resonator element 12 are maintained, and thus the oscillator 1 having high frequency stability can be obtained.

As shown in FIGS. 2A and 2B, the integrated circuit 10, the heating element 14 such as a power transistor or a resistance heating element, and the resonator element 12 arranged on an upper surface of the heating element 14 are accommodated inside the container 40. The inside of the container 40 is hermetically sealed in a reduced-pressure atmosphere such as vacuum, or an inert gas atmosphere such as nitrogen, argon, or helium.

The container 40 is composed of a package main body 42 and the lid member 44. As shown in FIG. 2B, the package main body 42 is formed by stacking a first substrate 46, a second substrate 48, a third substrate 50, a fourth substrate 52, and a fifth substrate 54. The second substrate 48, the third substrate 50, the fourth substrate 52, and the fifth substrate 54 are each a circular body with the central portion removed. A sealing member 56 such as a seal ring or low-melting-point glass is formed at the peripheral edge of an upper surface of the fifth substrate 54.

The second substrate 48 and the third substrate 50 form a recess (cavity) to accommodate the integrated circuit 10. The fourth substrate 52 and the fifth substrate 54 form a recess (cavity) to accommodate the heating element 14 and the resonator element 12.

The integrated circuit 10 is bonded at a predetermined position on an upper surface of the first substrate 46 with a bonding member 36. The integrated circuit is electrically connected through bonding wires 30 to electrode pads (not shown) arranged on an upper surface of the second substrate 48.

The heating element 14 is bonded at a predetermined position on an upper surface of the third substrate 50 with a bonding member 34. Electrode pads 26 formed on the upper surface (active surface 15) of the heating element 14 are electrically connected through bonding wires 30 to electrode pads (not shown) arranged on an upper surface of the fourth substrate 52.

Accordingly, since the integrated circuit 10 and the heating element 14 are arranged spaced apart from each other inside the container 40, it is difficult for the heat of the heating element 14 heating the resonator element 12 to be directly conducted to the integrated circuit 10. Therefore, it is possible to control the characteristic degradation of the circuit for oscillation included in the integrated circuit 10 caused by overheating.

The resonator element 12 as an SC-cut quartz crystal resonator element that exhibits the lowest external stress sensitivity among quartz crystal resonator elements and thus has excellent frequency stability is arranged on the active surface 15 of the heating element 14. Moreover, the SC-cut quartz crystal resonator element (the resonator element 12) is bonded to the heating element 14 with the electrode pads 26 formed on the active surface 15 and electrode pads (not shown) formed on a lower surface of the resonator element 12 via a bonding member 32 such as a metal bump or a conductive adhesive therebetween. Excitation electrodes (not shown) formed on the upper and lower surfaces of the resonator element 12 are electrically connected respectively to the electrode pads (not shown) formed on the lower surface of the resonator element 12. It is sufficient that the resonator element 12 and the heating element 14 are connected so as to allow heat generated by the heating element 14 to be conducted to the resonator element 12. Therefore, for example, the resonator element 12 and the heating element 14 may be connected with a non-conductive bonding member, and the resonator element 12 and the heating element 14 or the package main body 42 may be electrically connected using a conductive member such as a bonding wire.

Accordingly, since the resonator element 12 is arranged on the heating element 14, the heat of the heating element 14 can be conducted to the resonator element 12 without loss of the heat, and thus temperature control of the resonator element 12 can be further stabilized at low power consumption.

For the constituent material of the cover 64 of the container 60 and the lead frame 66, a low-thermal-conductivity iron-based alloy, such as 42 Alloy (iron-nickel alloy), plated with nickel is preferred.

Moreover, the base substrate 62 of the container 60 is formed of an insulative material such as glass epoxy resin or ceramics. Moreover, wiring provided in the base substrate 62 is formed by a method of etching a substrate with copper foil covered on its entire surface, or a method of screen printing a metal wiring material such as tungsten (W) or molybdenum (Mo) on a substrate, baking the material, and plating nickel (Ni), gold (Au), or the like thereon.

Further, although the embodiment has been described in which a rectangular SC-cut quartz crystal resonator element is used as the resonator element 12, this is not restrictive. A circular SC-cut quartz crystal resonator element or a rectangular or circular AT-cut quartz crystal resonator element may be used. Alternatively, a tuning fork type quartz crystal resonator element, a surface acoustic wave resonator element, and other piezoelectric resonators, or a micro electro mechanical systems (MEMS) resonator element may be used. When the AT-cut quartz crystal resonator element is used, a B-mode suppression circuit is not required, and thus the size of the oscillator 1 is reduced.

Oscillation Circuit

Next, an oscillation circuit of the oscillator 1 according to the invention will be described with reference to FIG. 3.

Figure 3:
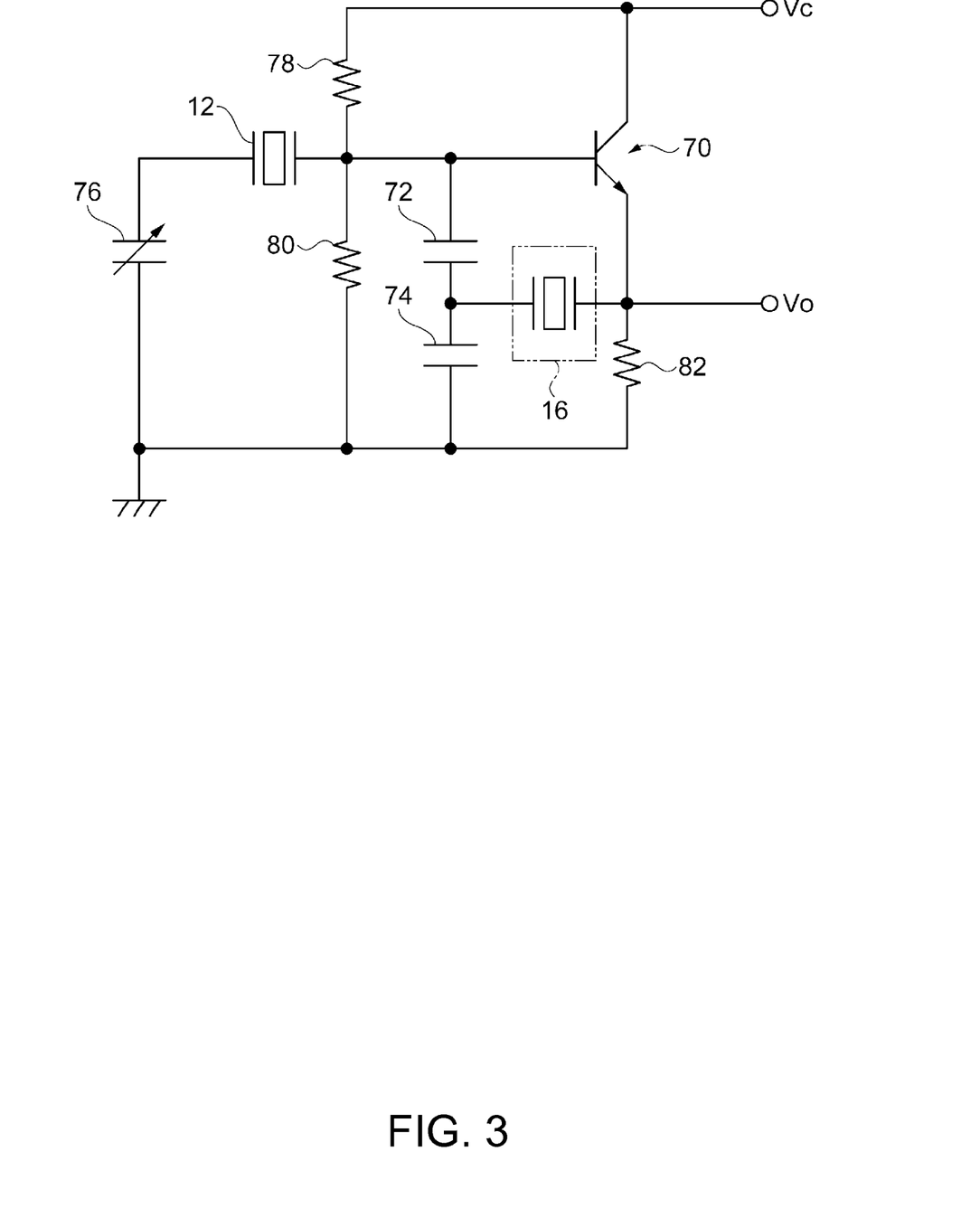
FIG. 3 is a circuit diagram showing a configuration of the oscillator according to the invention.

FIG. 3 is a circuit diagram showing the configuration of the oscillator 1 according to the invention.

In the SC-cut quartz crystal resonator element having excellent frequency stability, other than a thickness-shear vibration mode (C mode) as a primary vibration, a thickness-twist vibration mode (B mode) and a thickness-longitudinal vibration mode (A mode) exist as vibration modes at higher frequencies than the frequency of the thickness-shear vibration mode. Therefore, vibrations in the B mode and the A mode other than the C mode serve as spurious components (unwanted vibration components) and cause various troubles when the oscillator is configured. Especially a frequency f2 of the B mode next to the C mode as the primary vibration is only away from a frequency f1 of the C mode by about 9 to 10% of the frequency f1, and in addition, some resonance levels of the B mode are equal to those of the C mode. Therefore, the vibrations in the B mode and the A mode cause a frequency jump in which the oscillation frequency changes from f1 to f2.

As shown in FIG. 3, therefore, in the circuit for oscillation of the oscillator 1, a collector of a transistor 70 is connected to a power supply Vc, one end of the resonator element 12 as the SC-cut quartz crystal resonator element is connected to a base, and the other end of the SC-cut quartz crystal resonator element (the resonator element 12) is grounded via a variable capacitor 76. Then, a series circuit of dividing capacitors 72 and 74 is connected between the base of the transistor 70 and the ground, and the circuit element 16 as a quartz crystal resonator is inserted and connected between the emitter and the middle point (dividing point) of the series circuit of the dividing capacitors 72 and 74. Resistors 78 and 80 are bleeder resistors. A resistor 82 is a feedback resistor (load resistor). Vo is an output terminal of the oscillator 1. As the quartz crystal resonator (the circuit element 16), an AT-cut quartz crystal resonator element, for example, is used, and the series resonance frequency thereof is set so as to substantially coincide with the oscillation frequency of the primary vibration (the C mode).

By inserting the quartz crystal resonator (the circuit element 16) between the emitter of the transistor 70 and the middle point of the series circuit of the dividing capacitors 72 and 74, a feedback circuit is caused to have frequency selectivity to obtain a narrow-band negative resistance characteristic. Therefore, a sufficiently large negative resistance is obtained at the frequency f1 of the C mode as the primary vibration, while a small negative resistance or positive resistance is exhibited at the frequency f2 of the B mode. As a result, the oscillator cannot oscillate at the frequency of the B mode. Therefore, the oscillator 1 can be oscillated only in the C mode as the primary vibration, and thus the oscillator 1 having high frequency stability can be obtained.

The embodiment has been described in which a quartz crystal resonator is used as the circuit element 16. However, this is not restrictive, and an inductance element may be used. When an inductance element is used as the circuit element 16, an LC resonant circuit can be configured in combination with a capacitive element. By making the frequency of the LC resonant circuit coincident with the frequency of the primary vibration, the feedback circuit of the circuit for oscillation is caused to have frequency selectivity to obtain a narrow-band negative resistance characteristic, and an unnecessary spurious negative resistance can be made small or positive. Therefore, unnecessary spurious oscillation can be suppressed. Therefore, an unnecessary frequency is controlled, the oscillator 1 can be oscillated only in the primary vibration, and thus the oscillator 1 having high frequency stability can be obtained.

MODIFIED EXAMPLE

Next, modified examples of the oscillator 1 according to the first embodiment of the invention in mounting of a resonator element will be described with reference to FIGS. 4A to 4C.

Figure 4A:
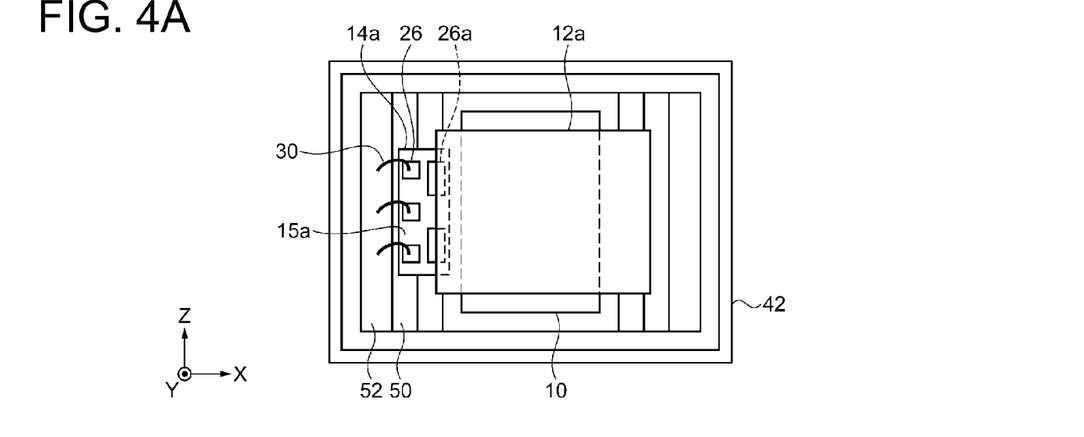
FIGS. 4A to 4C are schematic plan views each showing a modified example of the oscillator according to the invention.
Figure 4B:
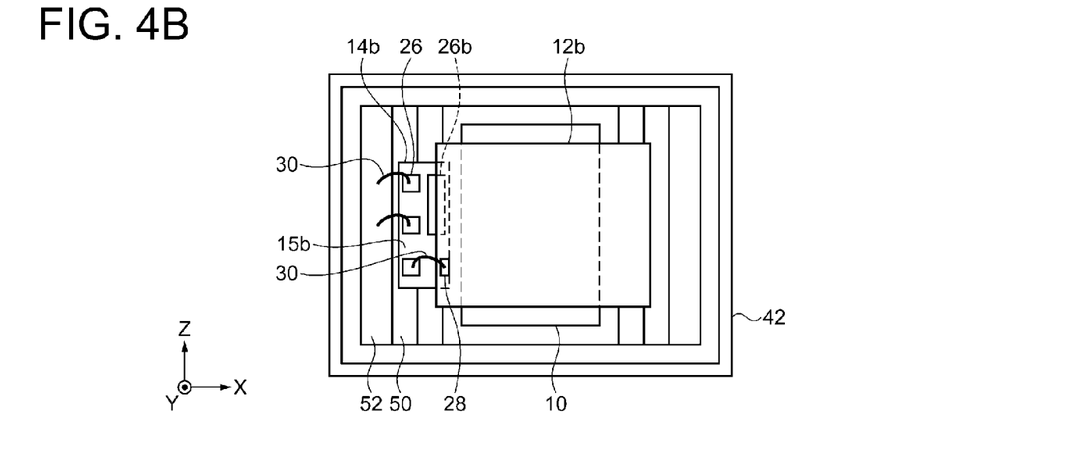
Figure 4C:
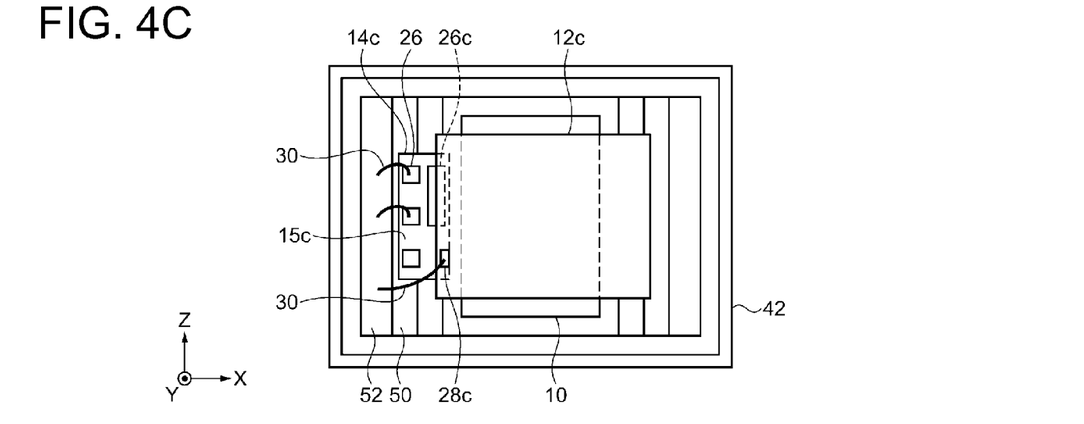

FIGS. 4A to 4C are schematic plan views each showing a modified example of the oscillator 1 according to the first embodiment of the invention in mounting of a resonator element. FIGS. 4A to 4C show a state where the lid member 44 (refer to FIG. 2B) is removed for convenience of description of the inner configuration of the container 40.

Hereinafter, the modified examples in mounting of a resonator element will be described mainly on differences from the first embodiment described above, and similar matters will not be described.

In the modified example shown in FIG. 4A, in electrode pads 26 and 26a formed on an active surface 15a of a heating element 14a, the area of the electrode pad 26a arranged on a lower surface of a resonator element 12a is larger than that of the electrode pad 26. Therefore, since the mounting area of the resonator element 12a can be made large, an impact due to dropping or vibration can be reduced, and thus the deterioration of vibration characteristics or the like can be prevented. Moreover, since the area for bonding the resonator element 12a with the heating element 14a is large, heat conduction is enhanced, and thus the oscillator 1 with low power consumption and having high frequency stability can be obtained.

In the modified example shown in FIG. 4B, in electrode pads 26 and 26b formed on an active surface 15b of a heating element 14b, the area of the electrode pad 26b arranged on a lower surface of a resonator element 12b is larger than that of the electrode pad 26. Moreover, an electrode pad 28 is formed on an upper surface of the resonator element 12b, and electrically connected through a bonding wire 30 to the electrode pad 26 formed on the active surface 15b of the heating element 14b. Since the resonator element 12b can be fixed at one point, mounting strain or thermal strain can be reduced, and thus more stable vibration characteristics can be obtained, compared to two-point fixation. Moreover, since the electrode pad 28 is formed on the upper surface of the resonator element 12b to thereby eliminate the need for an electrode pattern forming step for wiring an excitation electrode (not shown) formed on the upper surface of the resonator element 12b to a lower surface of the resonator element 12b, the cost of the resonator element 12b can be reduced.

The modified example shown in FIG. 4C has a configuration in which one electrode pad 26c is formed on an active surface 15c of a heating element 14c similarly to the modified example shown in FIG. 4B, and therefore equivalent advantageous effects can be obtained. Moreover, an electrode pad 28c is formed on an upper surface of a resonator element 12c, and electrically connected through a bonding wire 30 to an electrode pad (not shown) formed on the upper surface of the fourth substrate 52. Therefore, it is possible to prevent bonding failure due to a narrowed interval between the electrode pad 28c and the electrode pad 26 formed on the active surface 15c of the heating element 14c caused by a size reduction of the oscillator 1.

Second Embodiment

Next, an oscillator 1a according to a second embodiment of the invention will be described with reference to FIGS. 5A and 5B.

Figure 5A:
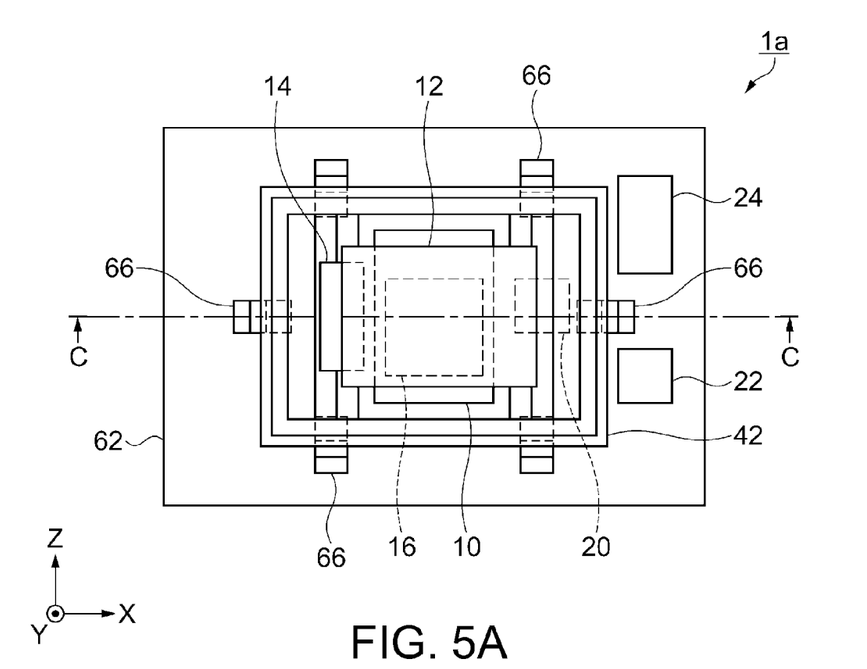
FIG. 5A is a plan view.
Figure 5B:
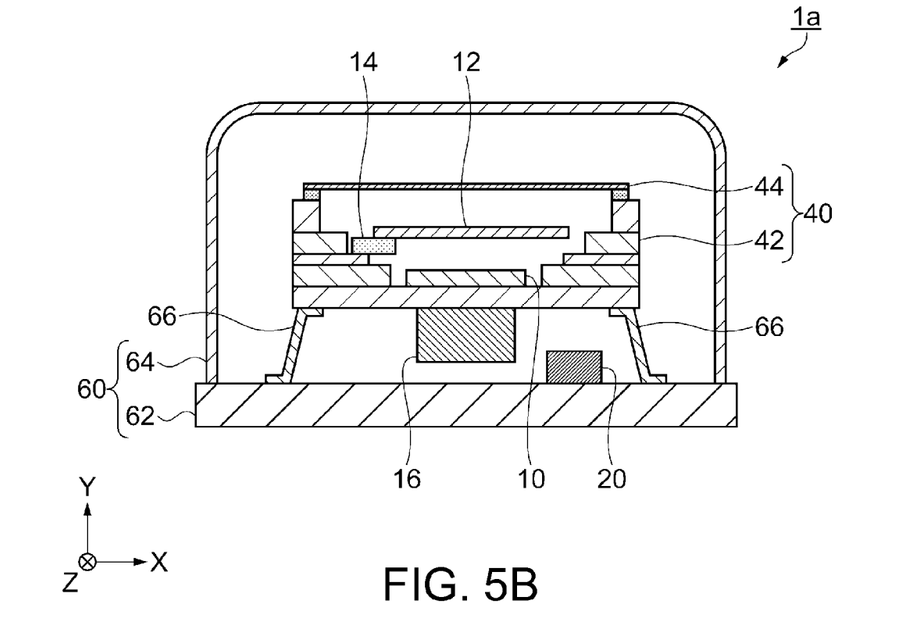
FIG. 5B is a cross-sectional view taken along the line C-C.

FIGS. 5A and 5B are schematic configuration diagrams of the oscillator 1a according to the second embodiment of the invention, in which FIG. 5A is a plan view, and FIG. 5B is a cross-sectional view taken along the line C-C in FIG. 5A. In FIG. 5A, the oscillator 1a in a state where an upper portion of the cover 64 is removed is shown for convenience of description of the inner configuration of the oscillator 1a.

Hereinafter, the second embodiment will be described mainly on differences from the first embodiment described above, and similar matters will not be described.

As shown in FIGS. 5A and 5B, the oscillator 1a according to the second embodiment differs from the oscillator 1 according to the first embodiment in that the circuit element 16 is arranged on a lower surface of the container 40.

With such a configuration, the heat of the heating element 14 can be conducted to the circuit element 16 through conduction via the package main body 42. Therefore, the temperature of the circuit element 16 can be held constant, the influence of external temperature change can be reduced, and thus the oscillator 1a having high frequency stability can be obtained.

Third Embodiment

Next, an oscillator 1b according to a third embodiment of the invention will be described with reference to FIGS. 6A and 6B.

Figure 6A:
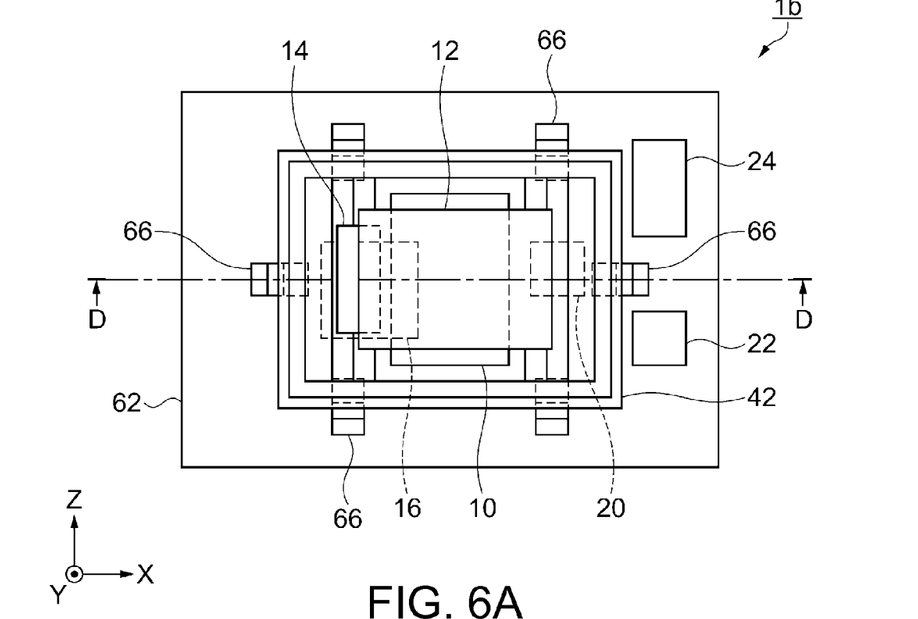
FIG. 6A is a plan view.
Figure 6B:
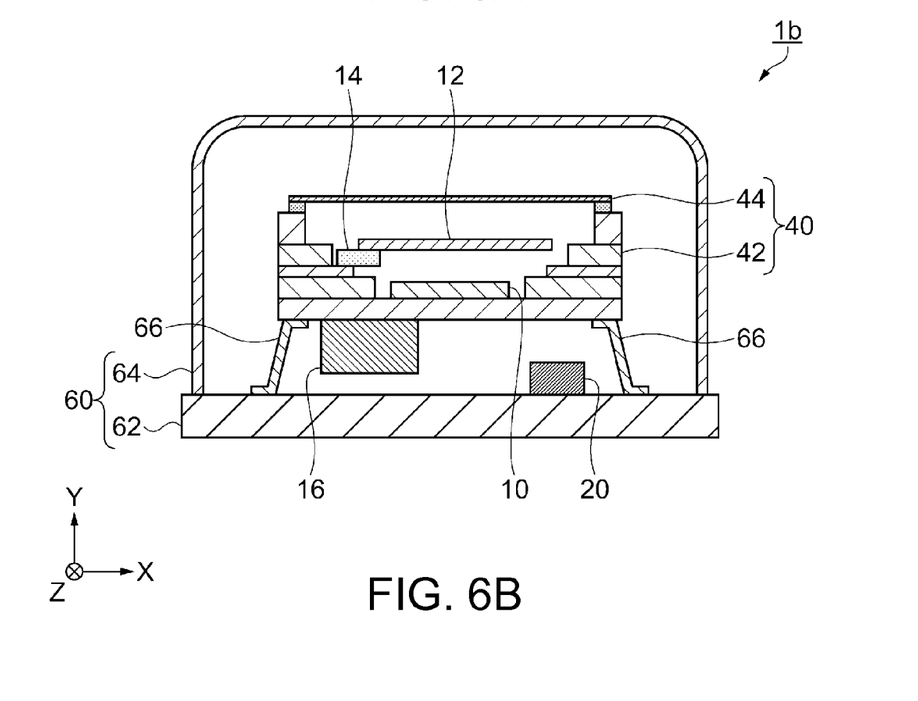
FIG. 6B is a cross-sectional view taken along the line D-D.

FIGS. 6A and 6B are schematic configuration diagrams of the oscillator 1b according to the third embodiment of the invention, in which FIG. 6A is a plan view, and FIG. 6B is a cross-sectional view taken along the line D-D in FIG. 6A. In FIG. 6A, the oscillator 1b in a state where the upper portion of the cover 64 is removed is shown for convenience of description of the inner configuration of the oscillator 1b.

Hereinafter, the third embodiment will be described mainly on differences from the first embodiment described above, and similar matters will not be described.

As shown in FIGS. 6A and 6B, the oscillator 1b according to the third embodiment differs from the oscillator 1 according to the first embodiment in that the circuit element 16 is arranged on the lower surface of the container 40 to overlap a region where the heating element 14 is arranged in a plan view.

With such a configuration, a distance from the heating element 14 to the circuit element 16 can be reduced in the package main body 42, and the heat of the heating element 14 can be more efficiently conducted to the circuit element 16 through conduction via the package main body 42. Therefore, the influence of external temperature change can be further reduced, and thus the oscillator 1b having high frequency stability can be obtained.

Fourth Embodiment

Next, an oscillator 1c according to a fourth embodiment of the invention will be described with reference to FIGS. 7A and 7B.

Figure 7A:
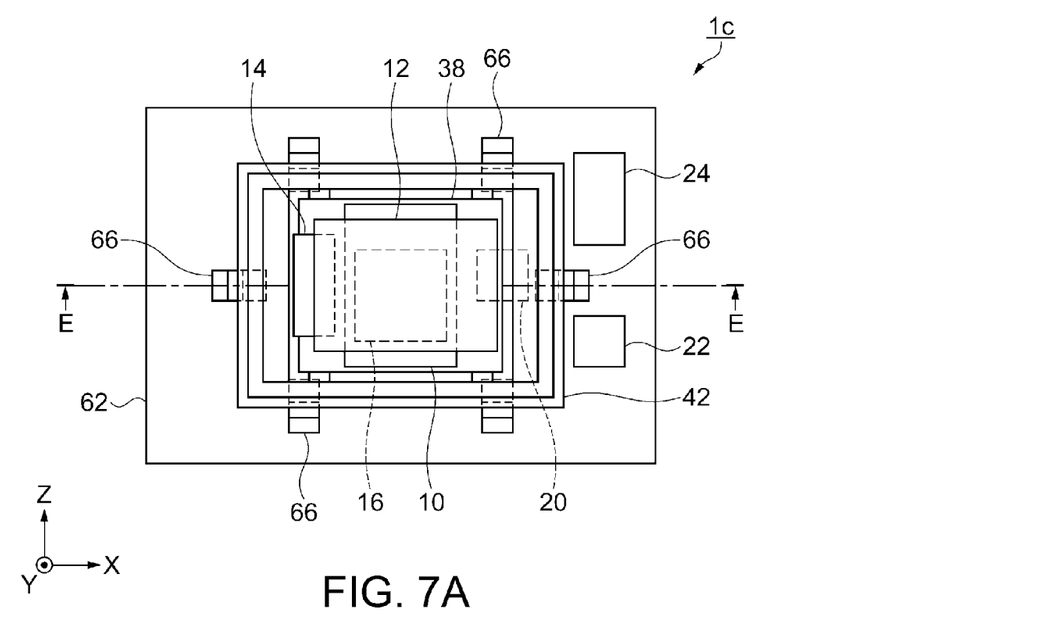
FIG. 7A is a plan view.
Figure 7B:
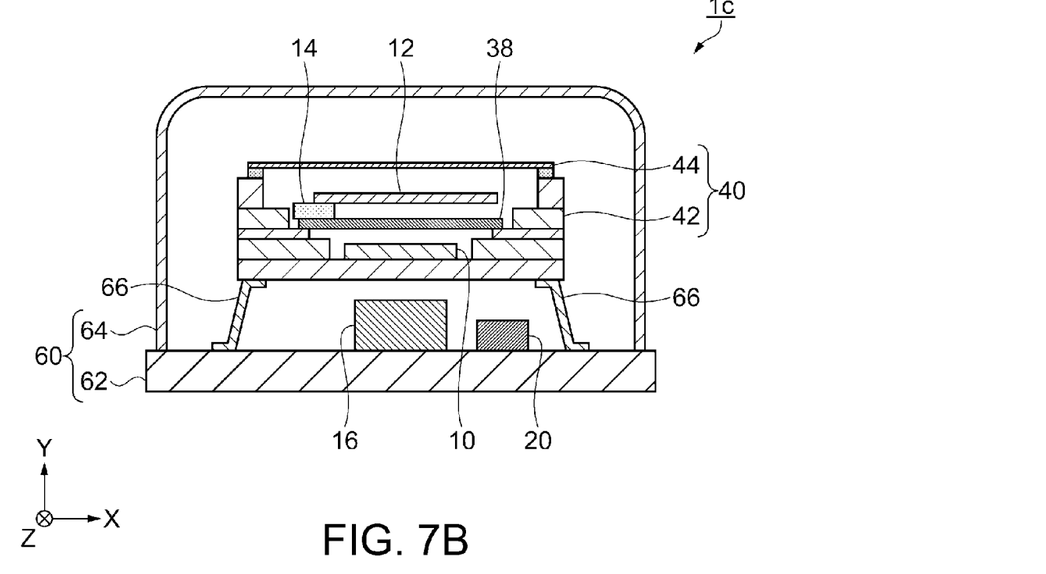
FIG. 7B is a cross-sectional view taken along the line E-E.

FIGS. 7A and 7B are schematic configuration diagrams of the oscillator 1c according to the fourth embodiment of the invention, in which FIG. 7A is a plan view, and FIG. 7B is a cross-sectional view taken along the line E-E in FIG. 7A. In FIG. 7A, the oscillator 1c in a state where the upper portion of the cover 64 is removed is shown for convenience of description of the inner configuration of the oscillator 1c.

Hereinafter, the fourth embodiment will be described mainly on differences from the first embodiment described above, and similar matters will not be described.

As shown in FIGS. 7A and 7B, the oscillator 1c according to the fourth embodiment differs from the oscillator 1 according to the first embodiment in that a spacer 38 is arranged on the upper surface of the third substrate 50 (refer to FIG. 2B) of the package main body 42 constituting the container 40, and the heating element 14 to which the resonator element 12 is bonded is arranged on an upper surface of the spacer 38.

With such a configuration, when the spacer 38 is formed of a low-thermal-conductivity material such as glass, the heat of the heating element 14 is conducted only to the resonator element 12, and thus the temperature of the resonator element 12 can be more stably kept. Moreover, when the spacer 38 is formed of a high-thermal-conductivity material such as copper (Cu), the heat of the heating element 14 can be conducted to the entire container 40, and therefore the integrated circuit 10 or the circuit element 16 can be kept at a stable temperature. Therefore, the oscillator 1c having high frequency stability can be obtained.

Fifth Embodiment

Next, an oscillator 1d according to a fifth embodiment of the invention will be described with reference to FIGS. 8A and 8B.

Figure 8A:
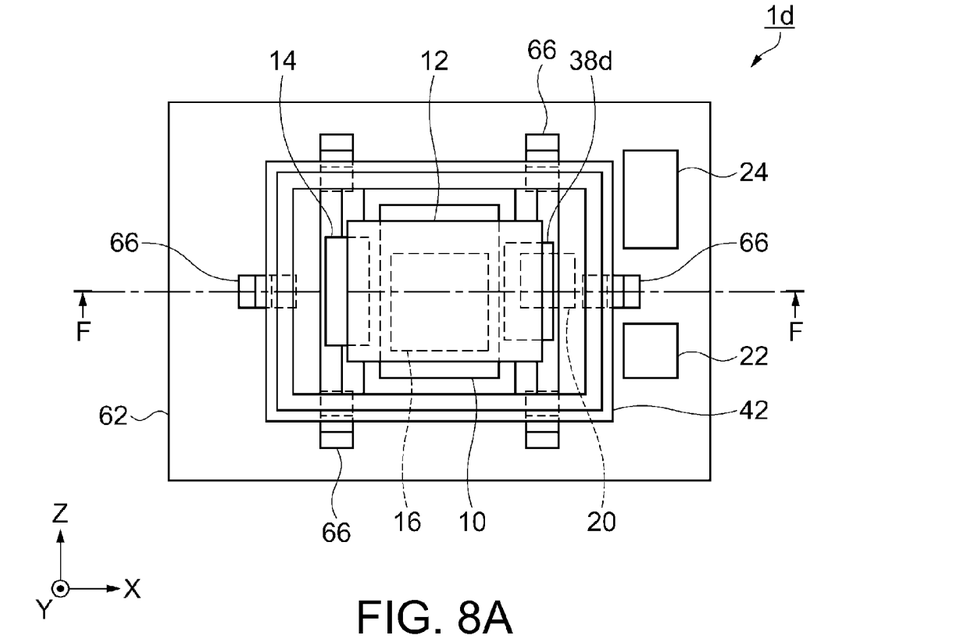
FIG. 8A is a plan view.
Figure 8B:
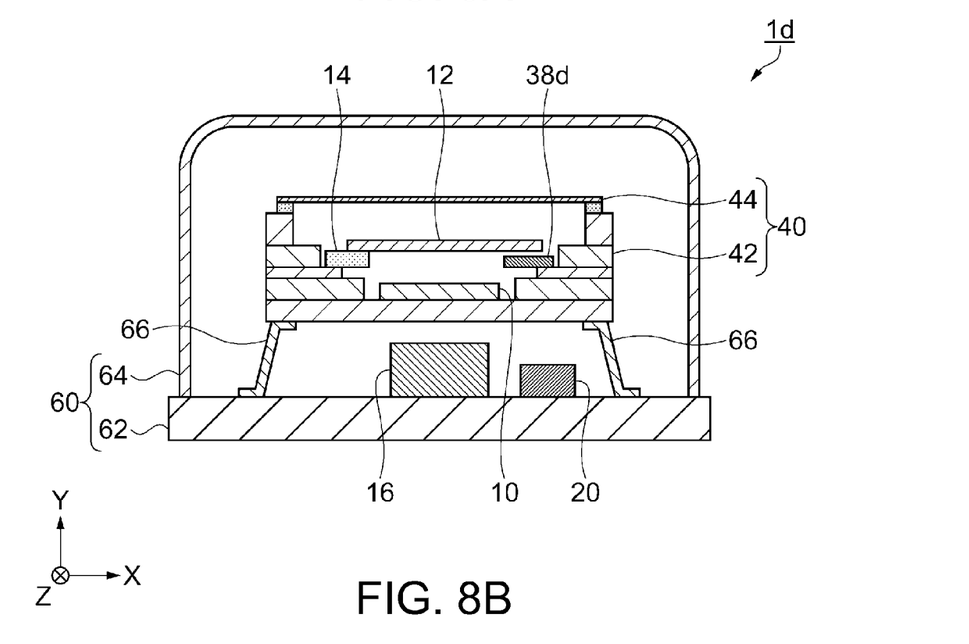
FIG. 8B is a cross-sectional view taken along the line F-F.

FIGS. 8A and 8B are schematic configuration diagrams of the oscillator 1d according to the fifth embodiment of the invention, in which FIG. 8A is a plan view, and FIG. 8B is a cross-sectional view taken along the line F-F in FIG. 8A. In FIG. 8A, the oscillator 1d in a state where the upper portion of the cover 64 is removed is shown for convenience of description of the inner configuration of the oscillator 1d.

Hereinafter, the fifth embodiment will be described mainly on differences from the first embodiment described above, and similar matters will not be described.

As shown in FIGS. 8A and 8B, the oscillator 1d according to the fifth embodiment differs from the oscillator 1 according to the first embodiment in that the position of the heating element 14 arranged on the upper surface of the third substrate 50 (refer to FIG. 2B) of the package main body 42 constituting the container 40 is different, and a spacer 38d is arranged at a position facing the heating element 14 in a plan view.

With such a configuration, when the resonator element 12 is bonded to the upper surface of the heating element 14, the inclining of the tip end (end in the positive X-axis direction) of the resonator element 12 can be reduced, and an impact due to dropping or vibration can be softened. Therefore, the oscillator 1d having excellent drop resistance or impact resistance can be obtained.

Electronic Apparatus

Next, electronic apparatuses to which the oscillator 1, the oscillator 1a, the oscillator 1b, the oscillator 1c, or the oscillator 1d according to one embodiment of the invention is applied will be described based on FIGS. 9A to 10.

Figure 9A:
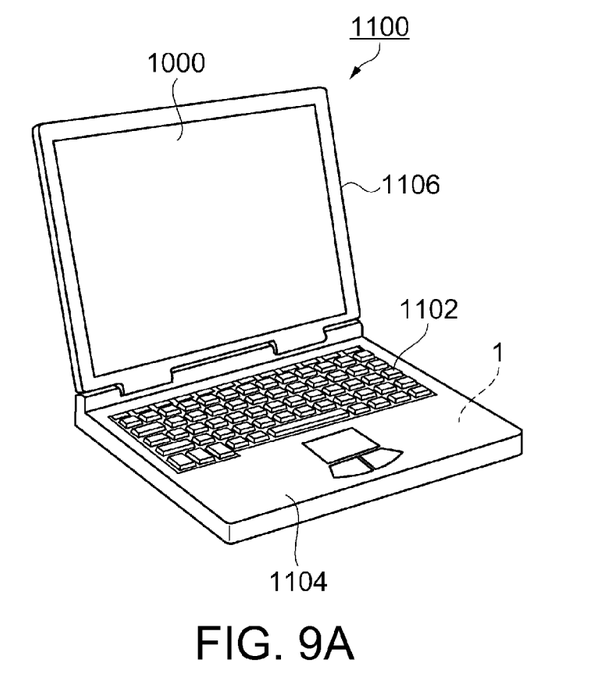
FIG. 9A is a perspective view showing a configuration of a mobile (or notebook) personal computer.
Figure 9B:
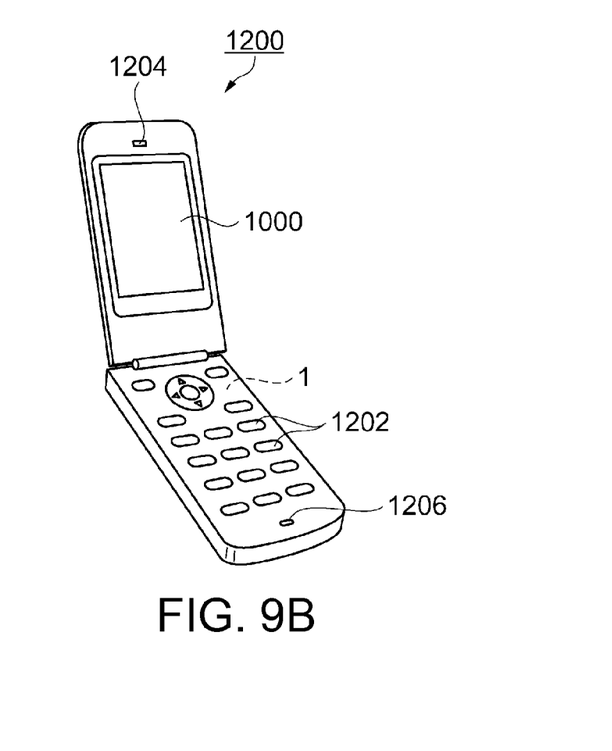
FIG. 9B is a perspective view showing a configuration of a mobile phone (including a PHS).

FIGS. 9A and 9B are schematic diagrams each showing an electronic apparatus including the oscillator 1, the oscillator 1a, the oscillator 1b, the oscillator 1c, or the oscillator 1d according to one embodiment of the invention, in which FIG. 9A is a perspective view showing a configuration of a mobile (or notebook) personal computer 1100, and FIG. 9B is a perspective view showing a configuration of a mobile phone 1200 (including a PHS).

In FIG. 9A, the personal computer 1100 is composed of a main body portion 1104 including a keyboard 1102 and a display unit 1106 including a display portion 1000. The display unit 1106 is rotatably supported relative to the main body portion 1104 via a hinge structure portion. The oscillator 1, the oscillator 1a, the oscillator 1b, the oscillator 1c, or the oscillator 1d having high frequency stability is built into the personal computer 1100.

In FIG. 9B, the mobile phone 1200 includes a plurality of operation buttons 1202, an earpiece 1204, and a mouthpiece 1206. The display portion 1000 is arranged between the operation buttons 1202 and the earpiece 1204. The oscillator 1, the oscillator 1a, the oscillator 1b, the oscillator 1c, or the oscillator 1d having high frequency stability is built into the mobile phone 1200.

Figure 10:
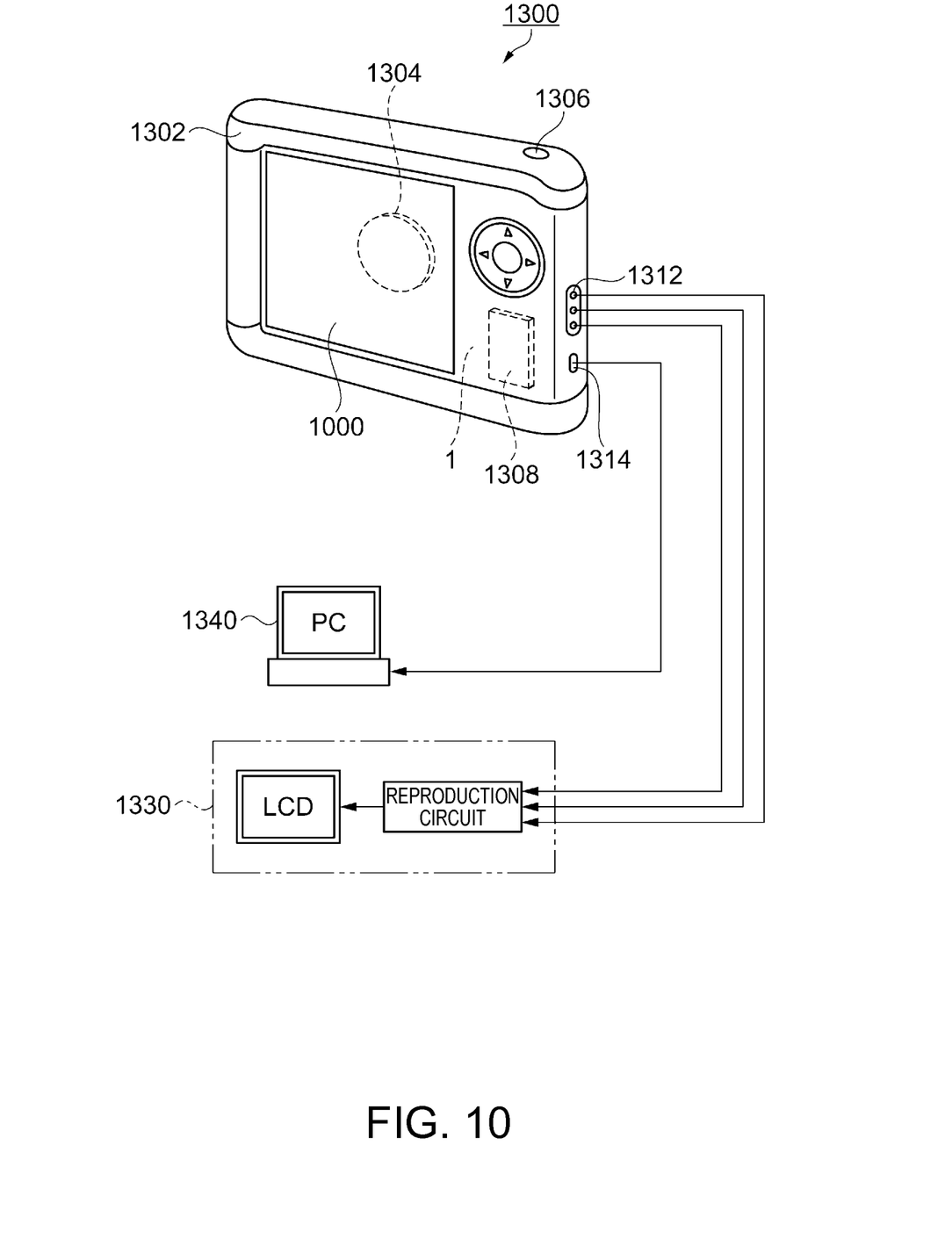
FIG. 10 is a perspective view showing a configuration of a digital camera as an electronic apparatus including the oscillator according to the invention.

FIG. 10 is a perspective view showing a configuration of a digital camera 1300 as an electronic apparatus including the oscillator 1, the oscillator 1a, the oscillator 1b, the oscillator 1c, or the oscillator 1d according to one embodiment of the invention. In FIG. 10, connections with external apparatuses are also shown in a simplified manner.

The digital camera 1300 photoelectrically converts an optical image of a subject with an imaging element such as a charge coupled device (CCD) to generate imaging signals (image signals).

The display portion 1000 is provided on a back surface of a case (body) 1302 in the digital camera 1300 and configured to perform display based on imaging signals generated by the CCD. The display portion 1000 functions as a finder that displays the subject as an electronic image. Moreover, on the front side (the rear side in the drawing) of the case 1302, a light receiving unit 1304 including an optical lens (imaging optical system) and the CCD is provided.

When a photographer confirms the subject image displayed on the display portion 1000 and presses down a shutter button 1306, imaging signals of the CCD at the time are transferred to and stored in a memory 1308. Moreover, in the digital camera 1300, a video signal output terminal 1312 and a data communication input/output terminal 1314 are provided on a side surface of the case 1302. Then, as shown in the drawing, a television monitor 1330 and a personal computer 1340 are connected as necessary to the video signal output terminal 1312 and the data communication input/output terminal 1314, respectively. Further, the imaging signals stored in the memory 1308 are output to the television monitor 1330 or the personal computer 1340 by a predetermined operation. The oscillator 1, the oscillator 1a, the oscillator 1b, the oscillator 1c, or the oscillator 1d having high frequency stability is built into the digital camera 1300.

As described above, the oscillator 1, the oscillator 1a, the oscillator 1b, the oscillator 1c, or the oscillator 1d having high frequency stability is utilized, whereby a higher-performance electronic apparatus can be provided as an electronic apparatus.

In addition to the personal computer 1100 (mobile personal computer) in FIG. 9A, the mobile phone 1200 in FIG. 9B, and the digital camera 1300 in FIG. 10, the oscillator 1, 1a, 1b, 1c, or 1d according to one embodiment of the invention can be applied to electronic apparatuses such as, for example, inkjet ejection apparatuses (for example, inkjet printers), laptop personal computers, television sets, video camcorders, car navigation systems, pagers, electronic notebooks (including those with communication function), electronic dictionaries, calculators, electronic gaming machines, workstations, videophones, surveillance television monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, and ships), flight simulators, apparatuses for mobile communication base station, storage area network apparatuses such as routers or switches, local area network apparatuses, and network transmission apparatuses.

Moving Object

Next, a moving object to which the oscillator 1, the oscillator 1a, the oscillator 1b, the oscillator 1c, or the oscillator 1d according to one embodiment of the invention is applied will be described based on FIG. 11.

Figure 11:
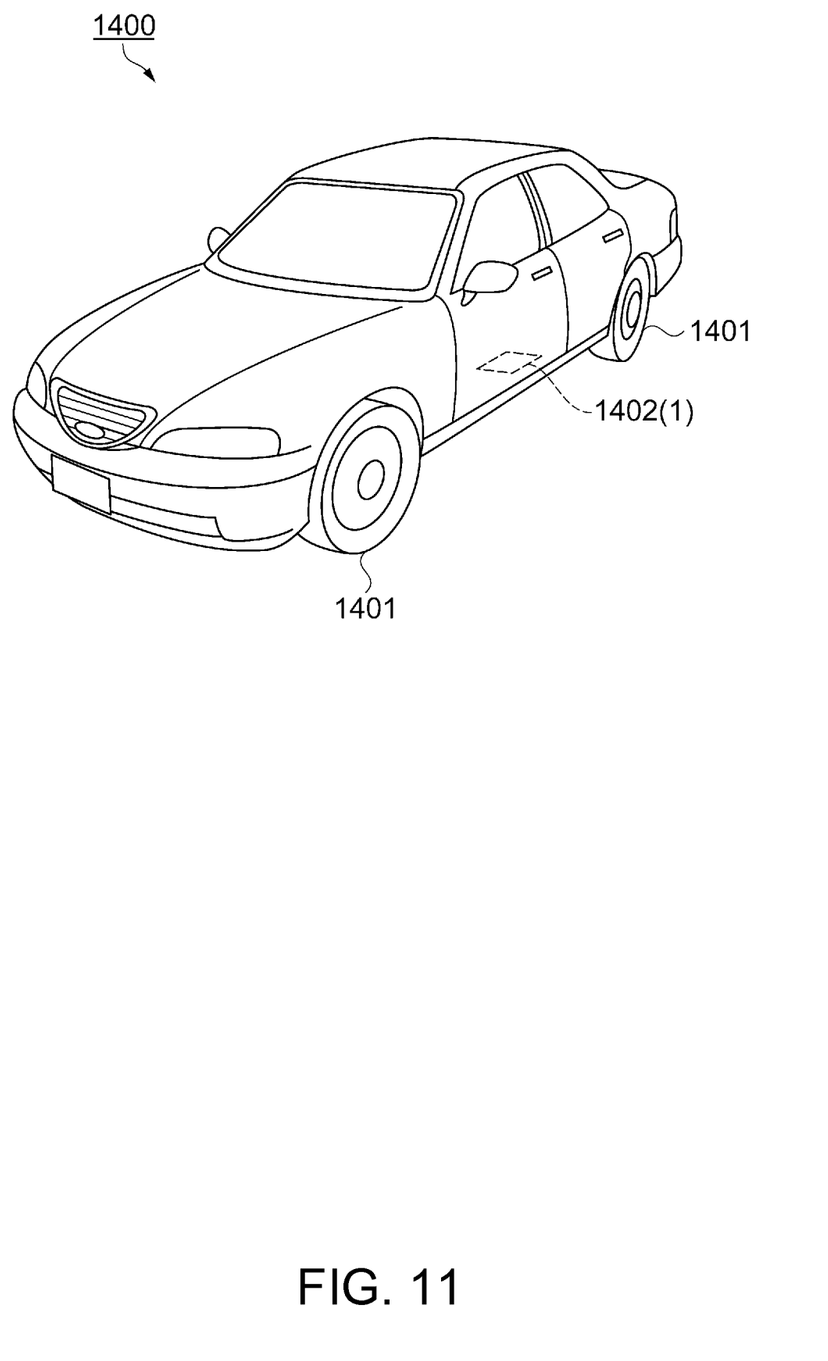
FIG. 11 is a perspective view showing a configuration of an automobile as a moving object including the oscillator according to the invention.

FIG. 11 is a perspective view showing a configuration of an automobile 1400 as a moving object including the oscillator 1, the oscillator 1a, the oscillator 1b, the oscillator 1c, or the oscillator 1d according to one embodiment of the invention.

In the automobile 1400, a gyro sensor configured to include the oscillator 1, the oscillator 1a, the oscillator 1b, the oscillator 1c, or the oscillator 1d according to the invention is mounted. For example, as shown in FIG. 11, an electronic control unit 1402 into which the gyro sensor to control tires 1401 is built is mounted in the automobile 1400 as a moving object. Moreover, as other examples, the oscillator 1, 1a, 1b, 1c, or 1d can be widely applied to electronic control units (ECUs) such as for keyless entry systems, immobilizers, car navigation systems, car air-conditioners, anti-lock brake systems (ABSs), air bags, tire pressure monitoring systems (TPMSs), engine control, battery monitors of hybrid and electric automobiles, and car body attitude control systems.

As described above, the oscillator 1, the oscillator 1a, the oscillator 1b, the oscillator 1c, or the oscillator 1d having high frequency stability is utilized, whereby a higher-performance moving object can be provided as a moving object.

Although the oscillators 1, 1a, 1b, 1c, and 1d, the electronic apparatuses, and the moving object according to the invention have been described above based on the embodiments shown in the drawings, the invention is not limited to the embodiments. The configuration of each part can be replaced with any configuration having a similar function. Moreover, any other configurations may be added to the invention. Moreover, the embodiments described above may be appropriately combined with each other.

The entire disclosure of Japanese Patent Application No. 2013-265005, filed Dec. 24, 2013 is expressly incorporated by reference herein.

What is claimed is:

1. An oscillator comprising:
   a container;
   an integrated circuit arranged inside the container, the integrated circuit including a circuit for oscillation;
   a circuit element arranged outside the container, the circuit element including a quartz crystal resonator;
   a heating element arranged inside the container;
   a resonator element arranged on the heating element and inside the container; and
   a housing in which the container and the circuit element are disposed.

2. The oscillator according to claim 1, wherein the circuit element includes an inductance element.

3. The oscillator according to claim 1, wherein
   the resonator element is an SC-cut quartz crystal resonator element, and
   the circuit element is for attenuating an unnecessary frequency of frequency signals output from the circuit for oscillation.

4. The oscillator according to claim 1, wherein the circuit element is arranged on the container.

5. The oscillator according to claim 2, wherein the circuit element is arranged on the container.

6. The oscillator according to claim 3, wherein the circuit element is arranged on the container.

7. The oscillator according to claim 4, wherein the circuit element overlaps the heating element in a plan view.

8. The oscillator according to claim 5, wherein the circuit element overlaps the heating element in a plan view.

9. The oscillator according to claim 6, wherein the circuit element overlaps the heating element in a plan view.

10. The oscillator according to claim 1, wherein
    the integrated circuit and the heating element are spaced apart from each other.

11. The oscillator according to claim 2, wherein
    the integrated circuit and the heating element are spaced apart from each other.

12. The oscillator according to claim 3, wherein
    the integrated circuit and the heating element are spaced apart from each other.

13. The oscillator according to claim 4, wherein
    the integrated circuit and the heating element are spaced apart from each other.

14. The oscillator according to claim 7, wherein
    the integrated circuit and the heating element are spaced apart from each other.

15. An electronic apparatus comprising the oscillator according to claim 1.

16. A moving object comprising the oscillator according to claim 1.

* * * * *